United States Patent
Naito et al.

(10) Patent No.: US 7,697,304 B2
(45) Date of Patent: Apr. 13, 2010

(54) ELECTROMAGNETIC WAVE SHIELDING DEVICE

(75) Inventors: Nobuo Naito, Tokyo-to (JP); Fumihiro Arakawa, Tokyo-to (JP); Kazuhito Fuji, Tokyo-to (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 435 days.

(21) Appl. No.: 11/632,857

(22) PCT Filed: Jul. 25, 2005

(86) PCT No.: PCT/JP2005/013595

§ 371 (c)(1),
(2), (4) Date: Jan. 19, 2007

(87) PCT Pub. No.: WO2006/011456

PCT Pub. Date: Feb. 2, 2006

(65) Prior Publication Data

US 2008/0084681 A1    Apr. 10, 2008

(30) Foreign Application Priority Data

Jul. 27, 2004 (JP) .............................. 2004-218046

(51) Int. Cl.
*H05K 9/00* (2006.01)
(52) U.S. Cl. ....................... 361/818; 361/749
(58) Field of Classification Search ............... 361/818, 361/749
See application file for complete search history.

(56) References Cited

U.S. PATENT DOCUMENTS

2005/0244609 A1 * 11/2005 Arakawa et al. ............ 428/137

FOREIGN PATENT DOCUMENTS

| JP | A-2002-311843 | 10/2002 |
| JP | A-2002-323861 | 11/2002 |
| JP | A-2004-117545 | 4/2004 |
| JP | B2-3570420 | 7/2004 |
| WO | WO 2004/016058 A1 | 2/2004 |
| WO | WO 2004016058 A1 * | 2/2004 |

* cited by examiner

*Primary Examiner*—Jinhee J Lee
*Assistant Examiner*—Abiy Getachew
(74) *Attorney, Agent, or Firm*—Oliff & Berridge, PLC

(57) ABSTRACT

An electromagnetic wave shielding device 1 comprises a transparent substrate 11, an adhesive layer 13 which is provided as needed, an electromagnetic wave shielding layer 15, and a transparent resin layer 17. The electromagnetic wave shielding layer 15 includes a mesh portion 103 facing a screen portion 100 of an image displaying device, a transparent resin layer anchoring portion 105 surrounding a periphery of the mesh portion 103, and including openings 105a having the same opening ratio as that of the openings 103a of the mesh portion 103, and a frame portion 107 surrounding an outer periphery of the transparent resin layer anchoring portion 105, and not having openings. The transparent resin layer 17 is provided such that it covers the surfaces of the mesh portion 103, and the transparent resin layer anchoring portion 105, and fills the openings 103a, 105a.

6 Claims, 3 Drawing Sheets

ELECTROMAGNETIC WAVE SHIELDING DEVICE

FIELD OF THE INVENTION

The present invention relates to a sheet for shielding electromagnetic waves, and, more particularly, to an electromagnetic wave shielding material (electromagnetic wave shielding device) that is mounted on the front of a display, such as a CRT or a PDP, to shield electromagnetic waves that the display generates.

In this Specification, "display", "CRT", and "PDP" are the abbreviations, functional expressions, common designations, or industrial terms of "image-displaying device", "cathode ray tube (Braun tube)", and "plasma display panel", respectively.

BACKGROUND ART (Background Art) Electromagnetic interference (EMI) has increased in recent years with the advances in the performance of electrical and electronic equipment and the growing use of such equipment. A variety of displays are the cause of EMI as well. For example, a PDP is an assembly composed of a glass plate having a data electrode and a fluorescent layer and a glass plate having a transparent electrode, and generates a large amount of electromagnetic waves when it is in operation, so that it is necessary to shield these electromagnetic waves. The required efficiency in shielding electromagnetic waves with frequencies of 30 MHz to 1 GHz that are emitted from the front of a PDP is 30 dB or more. Electromagnetic wave noises are roughly classified into conductive noise and emissive noise. To reduce conductive noise, a noise filter or the like is commonly used. On the other hand, since electromagnetic insulation of space is needed to cut emissive noise, a metal is used to produce the body of the display, a metal plate is placed between the circuit bases, or the cables are wrapped in metal foil. These measures are effective in shielding electromagnetic waves emitted from the circuits or power blocks, but not effective in cutting electromagnetic waves emitted from the screens of such displays as CRTs and PDPs. Moreover, to cover the screens with metal plates is not appropriate because metal plates are not transparent.

Accordingly, for shielding of electromagnetic waves emitted from display screens, there have been proposed a variety of electromagnetic wave shielding materials (electromagnetic wave shielding devices) that can shield electromagnetic waves with frequencies in the range of megahertz to gigahertz, and, at the same time, are transparent to electromagnetic waves with frequencies in the visible light range. Such electromagnetic wave shielding materials are now commercially available. Of these electromagnetic wave shielding materials, the most typical one is an electromagnetic wave shielding material composed of a transparent substrate made of a resin sheet and a mesh (network or grating) made from a metallic electrical conductor, laminated to the transparent substrate. In electromagnetic wave shielding materials of this type, recently demanded is an electromagnetic wave shielding material having such a structure as is shown in FIG. 4, in which irregularities in the metal mesh surface are smoothed by further applying a transparent resin to the metal mesh and filling the openings of the metal mesh with the resin.

The recent displays, especially PDPs, are characterized by having large-sized screens. The sizes (external dimensions) of electromagnetic wave shielding materials for use as front panels for such displays are as large as 621×831 mm for 37-inch displays and 983×583 mm for 42-inch displays, for example, and there exist electromagnetic wave shielding materials larger in size than these ones. It has been found that, in the whole process ranging from the production of an electromagnetic wave shielding sheet comprising a metal mesh and a transparent resin layer formed on the metal mesh, to the incorporation of the electromagnetic wave shielding material in a display, and also for a long duration of service, the transparent resin layer can lift from or can be separated from the metal mesh because of the large size of the electromagnetic wave shielding sheet.

As shown in FIG. 4, a transparent resin layer 17 has to fully cover a mesh portion 103 that will be faced to a display screen 100. It is necessary to make the area of coating of the transparent resin layer 17 greater than the area of the mesh portion 103 so that the mesh portion 103 is fully covered with the transparent resin layer 17 even if the position of application of a transparent resin varies (positional errors are caused). Further, the transparent resin applied flows and spreads towards the periphery before it is solidified. Practically, therefore, the transparent resin layer is formed so that it covers the entire mesh portion 103 and a 2-3-mm wide, mesh portion-surrounding portion (portion B) of a frame area (a metal layer having no openings) 101 to be used for grounding. In the mesh portion 103, it is easy for the transparent resin layer 17 and the metal mesh 103 to firmly adhere to each other because of the anchor effect taking place between the transparent resin layer 17 and the metal mesh 103 and of the chemical adhesion of the transparent resin layer 17 to an adhesive layer 13. However, in the frame area 101, the transparent resin layer 17 is in contact only with the metal layer that is smooth, so that neither the anchor effect nor the chemical adhesion to the adhesive layer 13 can be anticipated. Moreover, the portion B is the end of an interface between the transparent resin layer 17 and the electromagnetic wave shielding layer (metal layer) 15, so that stress concentrates in this portion. It is therefore considered that the separation of the transparent resin layer 17 from the metal mesh 103 easily occurs in this portion.

Accordingly, in addition to excellent electromagnetic wave shielding properties and moderate transparency (visible light transmittance), a requirement that constituent layers do not cause lifting or separation in the course of production and for the duration of service has come to be newly imposed to those electromagnetic wave shielding materials for displays that use metal meshes.

(Prior Art) Heretofore, there has been known an electromagnetic wave shielding material comprising a transparent plastic substrate and a mesh portion formed on the transparent plastic substrate by the use of an electrically conductive material such as a metal, in which irregularities of the mesh surface are smoothed by partly or entirely covering the mesh portion with a transparent resin layer (see Patent Documents 1 and 2, for example).

The above inventions are aimed at preventing, by filling the openings of the mesh with the transparent resin to smooth the mesh surface, irregular reflection of light that is caused by air bubbles remaining after such a layer as an antireflection filter has been laminated to the mesh surface with an adhesive layer, and also enhancing transparency by smoothing the roughened surface of the adhesive layer exposed at the openings. However, in an attempt to carry out these inventions to make the electromagnetic wave shielding material, we encountered another problem that should be solved. An electromagnetic wave shielding material for a display screen usually has, around a mesh portion, a metallic frame area 101 for grounding, having no openings. A transparent resin layer 17 with which the entire surface of the mesh portion 103 should be coated is formed on an area larger than the mesh portion 103 in order to ensure that the mesh portion 103 is fully covered with the transparent resin layer 17 even if the position of application of a transparent resin varies, and, in addition, the transparent resin applied flows and spreads, so that the end portion B of the transparent resin layer 17 comes in the frame area 101. In the frame area 101, the transparent resin layer 17 is in contact with a flat, smooth metal surface, so that the adhesion between the transparent resin layer 17 and the frame area 101 is inherently weaker than the adhesion between the transparent resin layer and the mesh portion. Moreover, external forces are exerted on the end portion B of the transparent resin layer, and peel stress thus concentrates in this portion. The newly raised problem is that the separation of the transparent resin layer 17 from the frame area 101 frequently occurs in the end portion B for the above-described reason. The above-described patent documents neither describe nor suggest this problem, that is, the lifting or separation of constituent layers of an electromagnetic wave shielding material, and a means of solving the problem.

Patent Document 1: Japanese Patent No. 3570420.

Patent Document 2: Japanese Laid-Open Patent Publication No. 311843/2002.

DISCLOSURE OF THE INVENTION

The present invention was accomplished in order to solve the above-described problem in the prior art. An object of the present invention is, therefore, to provide an electromagnetic wave shielding device having excellent electromagnetic wave shielding properties and moderate transparency (visible light transmittance), in which a transparent resin layer does not lift from or is not separated from an electrical-conductor-made electromagnetic wave shielding layer in the course of production and for the duration of service, by making a transparent resin layer anchoring portion around a mesh portion and forming a transparent resin layer so that it covers at least a part of the transparent resin layer anchoring portion.

The present invention is an electromagnetic wave shielding device disposed adjacent to the front surface of an image displaying device, comprising: a transparent substrate, an electromagnetic wave shielding layer on one surface of the transparent substrate and formed of an electrical conductive material; and a transparent resin layer provided on the electromagnetic wave shielding layer, wherein the electromagnetic wave shielding layer includes a mesh portion corresponding to a screen portion of the image displaying device, including openings arranged in large numbers, a transparent resin layer anchoring portion surrounding the mesh portion, including opening arranged in large numbers and having the same opening ratio as that of the openings in the mesh portion, and a flat frame portion surrounding the transparent resin layer anchoring portion and not, having openings, and wherein the transparent resin layer is provided such that it extends over the surface of the mesh portion as well as over the surface of the transparent resin layer anchoring portion.

The present invention is the electromagnetic wave shielding device according to claim 1, wherein the transparent resin layer extends over the whole surface of the mesh portion as well as over the whole surface of the transparent resin layer anchoring portion and also covers an inner end portion of the frame portion.

The present invention is the electromagnetic wave shielding device according to claim 1, wherein the transparent resin layer extends the whole surface of the mesh portion as well as over the whole surface of the transparent resin layer anchoring portion, and terminates at the outer end portion of the transparent resin layer anchoring portion.

The present invention is the electromagnetic wave shielding device according to claim 1, wherein the transparent resin layer is provided to cover the whole surface of the mesh portion and an inner end portion of the transparent resin layer anchoring portion.

The present invention is the electromagnetic wave shielding device according to claim 4, wherein the transparent resin layer extends over the whole surface of the mesh portion up to a middle of the transparent resin layer anchoring portion, but does not cover the outer periphery of the transparent resin layer anchoring portion.

The present invention is the electromagnetic wave shielding device according to claim 1, wherein an adhesive layer is interposed between the transparent substrate and the electromagnetic wave shielding layer.

The present invention provides the electromagnetic wave shielding material having excellent electromagnetic wave shielding properties and moderate transparency (visible light transmittance), in which the transparent resin layer does not lift from or is not separated from the electromagnetic wave shielding layer in the course of production and for the duration of service.

The present invention provides the electromagnetic wave shielding material advantageous in that a small amount of a material suffices to form the transparent resin layer, that minor variations in the position of coating of the transparent resin layer are allowable, that the constituent layers do not cause lifting or separation in the course of production and for the duration of service, and that the mesh portion that will be faced to a display screen is free of portions not covered with the transparent resin layer even if there are variations in the position of coating of the transparent resin layer.

The present invention provides the electromagnetic wave shielding material in which lifting or separation of the constituent layers does not occur with higher certainty in the course of production and for the duration of service, because the transparent substrate and the electromagnetic wave shielding layer that have been laminated with the adhesive layer firmly adhere to each other, and, moreover, the adhesive layer is exposed at the bottom of the openings of the mesh, so that the adhesion between the transparent substrate and the transparent resin layer that fills the openings is also strong.

BEST MODE FOR CARRYING OUT THE INVENTION

Embodiments of the present invention will be described in detail hereinafter with reference to the accompanying drawings.

Figure 1:
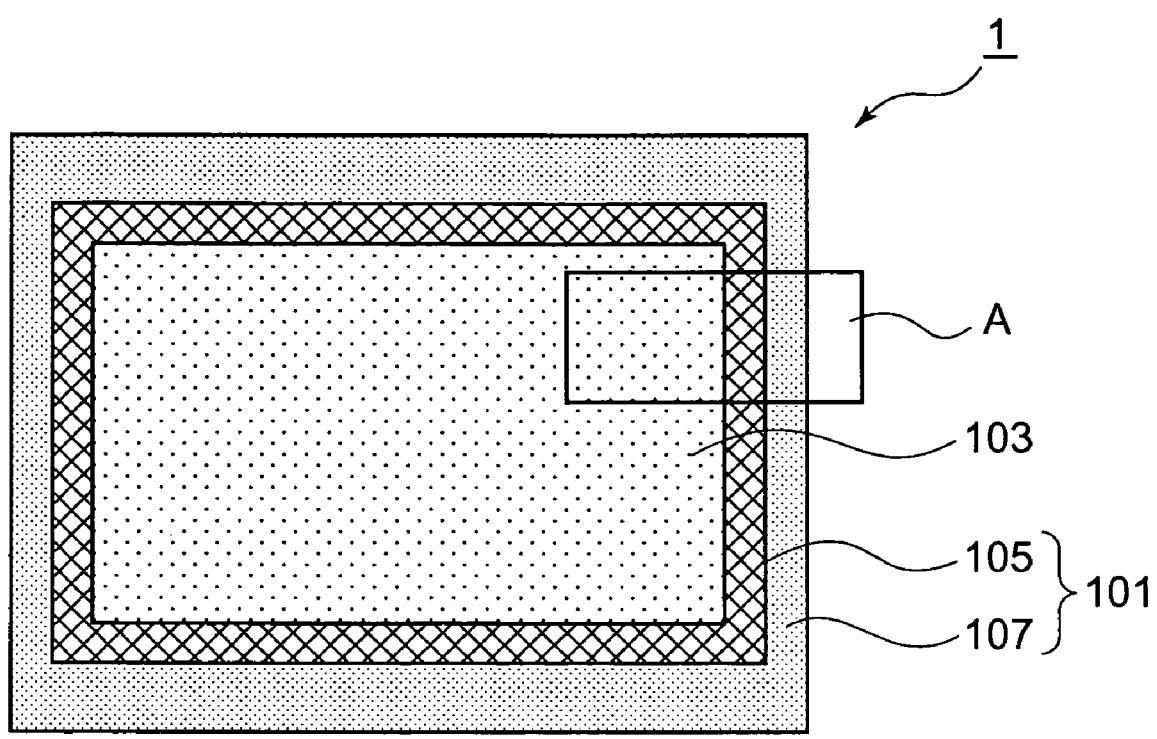
FIG. 1 is a plane view showing an electromagnetic wave shielding device according to the present invention.

FIG. 1 is a plane view showing an embodiment of the present invention.

Figure 2:
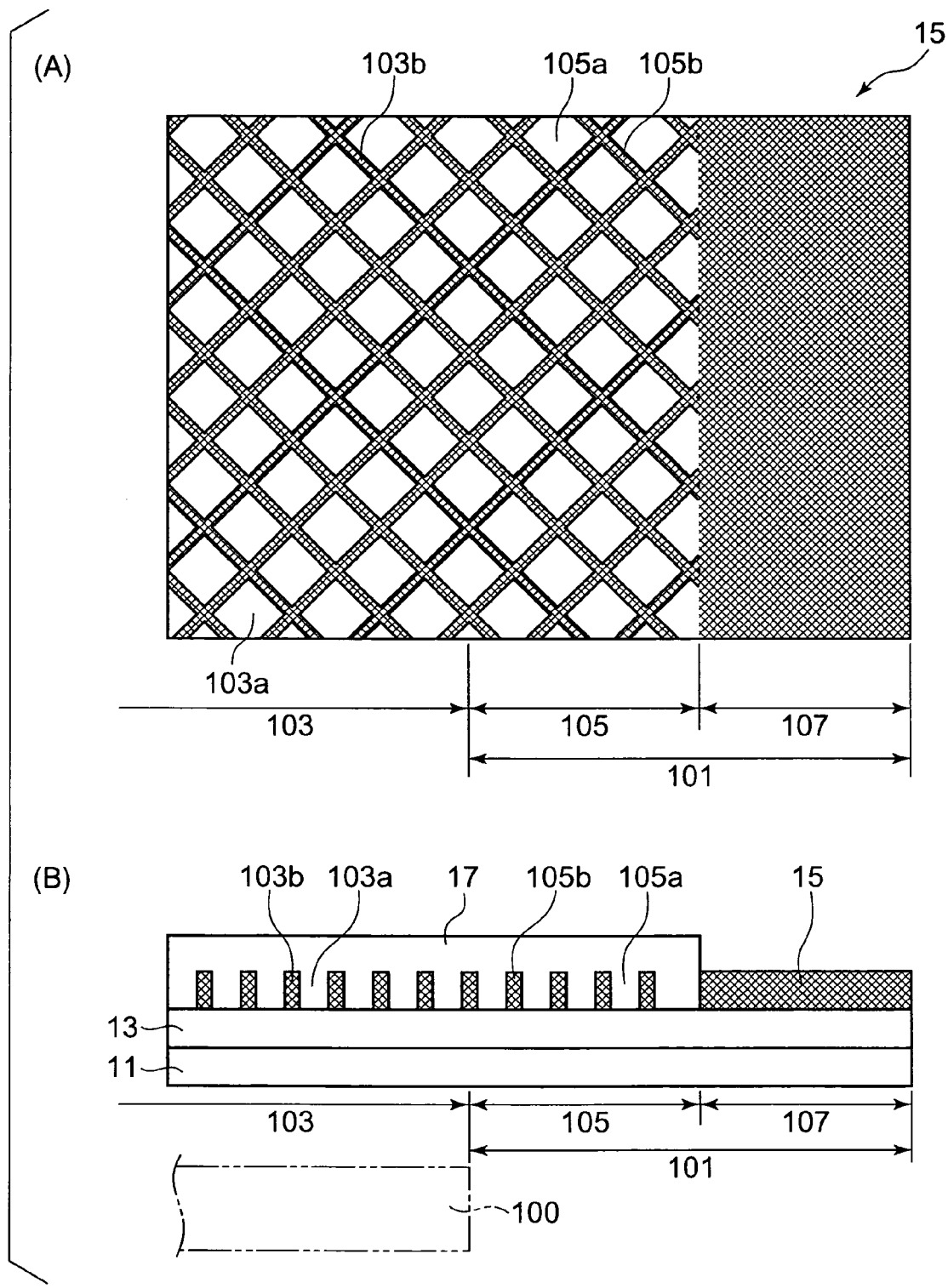
FIGS. 2(A) and 2(B) are an enlarged plane view and an enlarged cross-sectional view, respectively, of part A of FIG. 1.

FIGS. 2(A) and 2(B) are an enlarged plane view and an enlarged cross-sectional view, respectively, of part A of FIG. 1.

FIGS. 3(A), 3(B) and 3(C) are sectional views of the essential portions of electromagnetic wave shielding devices of the present invention, illustrating the position of constituent layers.

(Electromagnetic Wave Shielding Material) An electromagnetic wave shielding device (electromagnetic wave shielding material) according to the present invention will be described with reference to FIG. 1, FIG. 2, and FIGS. 3(A), 3(B) and 3(C).

As shown in FIG. 1 and FIGS. 2(A) and 2(B), an electromagnetic wave shielding device (electromagnetic wave shielding material) 1 is disposed on the front surface of a screen 100, that is, on the observer side, of such a display as a display panel (a PDP, etc.). Such an electromagnetic wave shielding device 1 comprises a transparent substrate 11, an electromagnetic wave shielding layer 15 provided on one surface of the transparent substrate 11 through an adhesive layer 13 and formed of an electrically conductive material, and a transparent resin layer 17 provided on the electromagnetic wave shielding layer 15.

Of these constituent layers, the electromagnetic wave shielding layer 15 includes a mesh portion 103 having a plurality of openings 103a arranged therein, a transparent resin layer anchoring portion 105 surrounding the mesh portion 103 having a plurality of openings 105a with the same opening ratio as that of the openings 103a, and a flat frame portion 107 surrounding the transparent resin layer anchoring portion 105, and not having openings. The mesh portion 103 is disposed facing the screen 100 of the image displaying device, such as a PDP, and has substantially the same shape as the screen 100.

The transparent resin layer anchoring portion 105 and the frame portion 107 constitute a frame area 101. Since the openings 105a in the transparent resin layer anchoring portion 105 will be situated outside the display screen 100, it is not necessary that the displayed image can be seen through these openings. Therefore, the openings 105a are not needed to fully penetrate the electromagnetic wave shielding layer 15, and non-through openings are acceptable for the openings 105a.

The mesh portion 103 has line portions 103b that define the openings 103a, the transparent resin layer anchoring portion 105 has line portions 105b that define the openings 105a, and the pattern of the openings 103a and that of the openings 105 are the same in size and shape. The opening ratio of the openings 103a in the mesh portion 103, therefore, agrees with the opening ratio of the openings 105a in the transparent resin layer anchoring portion 105.

Further, the frame portion 107 is connected to a ground wire when the electromagnetic wave shielding material 1 is provided adjoining to the screen 100 of the image display device.

Furthermore, as shown in FIG. 2(B), the transparent resin layer 17 extends over the whole surface of the mesh portion 103, as well as over the whole surface of the transparent resin layer anchoring portion 105, while filling the openings 103a, 105a. In this embodiment, the transparent resin layer 17 terminates at an outer edge portion of the transparent resin layer anchoring portion 105.

The transparent resin layer 17 may extend up to a middle portion of the transparent resin layer anchoring portion 105, but not cover the outer periphery of the transparent resin layer anchoring portion 105 (FIG. 3(B)).

The transparent resin layer 17 may extend over the entire surface of the transparent resin layer anchoring portion 105 and cover the inner edge portion of the frame portion 107 not having openings (FIG. 3(C)).

Preferably, the transparent resin layer 17 terminates at the outer edge portion of the transparent resin layer anchoring portion 105, and not extending over the frame portion 107 (FIG. 3(A)).

The material for and formation of each constituent layer of the electromagnetic wave shielding material 1 of the present invention will be described below.

(Transparent Substrate) A variety of materials having transparency, insulating properties, heat resistance, mechanical strength, and so forth good enough to withstand the service and production conditions can be used for the transparent substrate 11. Examples of materials useful herein include glass and transparent resins.

(Glass) Glass useful for the transparent substrate includes quarts glass, borosilicate glass, and soda-lime glass, and it is preferable to use non-alkali glass, which contains no alkali components and has a low rate of thermal expansion, good dimensional stability, and excellent working properties in high-temperature heat treatment. A glass substrate can be made to serve also as an electrode base for the image displaying device.

(Transparent Resins) Examples of transparent resins useful for the transparent substrate include polyester resins such as polyethylene terephthalate, polybutylene terephthalate, polyethylene naphthalate, terephthalic acid-isophthalic acid-ethylene glycol copolymers, and terephthalic acid-cyclohexane dimethanol-ethylene glycol copolymers; polyamide resins such as nylon 6; polyolefin resins such as polypropylene and polymethyl pentene; acrylic resins such as polymethyl methacrylate; styrene resins such as polystyrene and styrene-acrylonitrile copolymers; cellulose resins such as triacetyl cellulose; imide resins; and polycarbonate. A sheet, film, plate or the like of any of these resins can be used as the transparent substrate.

The transparent-resin-made transparent substrate may be made from a copolymer resin or a mixture (including a polymer alloy) containing, as a main component, any of the above-enumerated resins, or may also be a laminate of two or more layers. Although such a transparent substrate may be either an oriented or non-oriented film, a monoaxially or biaxially oriented film is preferably used in order to obtain increased strength. The thickness of the transparent-resin-made transparent substrate is usually about 12 to 1000 μm, preferably between 50 μm and 700 μm, most preferably between 100 μm and 500 μm. The preferred thickness of the glass-made transparent substrate is usually about 1000 to 5000 μm. In either case, a transparent substrate with a small thickness outside the above range cannot have sufficiently high mechanical strength, so that it curls, becomes wavy, or is broken; while a transparent substrate with a great thickness in excess of the above range has excessively high strength, which is wasteful from the viewpoint of cost.

In general, a film of a polyester resin such as polyethylene terephthalate or polyethylene naphthalate, or a glass plate is conveniently used as the transparent substrate because it is excellent in both transparency and heat resistance and is also inexpensive. Of these materials, a polyethylene terephthalate film is most preferred because it is hard to break, is light in weight, and is easy to form.

A transparent substrate having higher transparency is more favorable, and the preferred transparency, as indicated by the transmittance for visible light, is 80% or more.

Prior to the application of an adhesive, the transparent substrate surface to be coated with the adhesive may be subjected to adhesion-improving treatment such as corona discharge treatment, plasma treatment, ozone treatment, flame treatment, primer (also referred to as anchoring, adhesion-promoting or adhesion-improving agent) coating treatment, preheating treatment, dust-removing treatment, vacuum deposition, or alkali treatment. Additives such as ultraviolet light absorbers, fillers, plasticizers, and antistatic agents may be incorporated in the resin film, as needed.

(Electromagnetic Wave Shielding Layer) Any material having electrical conductivity good enough to shield electromagnetic waves can be used to form the electromagnetic wave shielding layer 15 for shielding electromagnetic waves. Typically, metals having electrical conductivity good enough to satisfactorily shield electromagnetic waves, such as gold, silver, copper, iron, nickel, chromium, and aluminum, are useful for the electromagnetic wave shielding layer 15. The electromagnetic wave shielding layer is formed by laminating metal foil, preformed as an independent layer, to the transparent substrate with an adhesive layer, or by depositing a metal layer directly on the transparent substrate by vacuum deposition, sputtering, plating, or the like. The metal may be either a single metal or an alloy, and the metal layer may be not only a layer of a single metal but also an alloy layer or a multi-layered film. Low-carbon steels such as low-carbon rimmed steels and low-carbon aluminum killed steels, Ni—Fe alloys, and invar alloys are herein preferred as iron materials. If cathodic electrodeposition is conducted, it is preferable to use copper or a copper alloy because such a material can be readily electrodeposited. Both rolled copper foil and electrolytic copper foil can be used as the copper preformed into a film, that is, copper foil, and electrolytic copper foil is preferred because it is uniform in thickness, firmly adheres to a blackening treatment and/or chromate (treatment) layer, and can have a thickness as small as below 10 µm. The thickness of the metal foil is about 1 to 100 µm, and preferably 5 to 20 µm. If the metal foil has a thickness of less than 1 µm, although it can be photolithographically processed into a mesh with ease, it has an increased electrical resistance value and thus shows impaired electromagnetic wave shielding effect. When the metal foil has a great thickness in excess of the above range, it cannot be made into the desired fine mesh. Consequently, the mesh has a decreased substantial opening ratio, a decreased light transmittance, and a narrower viewing angle, resulting in lower image visibility.

The surface roughness of the metal foil or layer is preferably 0.5 to 10 µm, as indicated by the Rz value. If the metal foil or layer has an Rz value of less than 0.5 µm, it specularly reflects extraneous light even if it has been subjected to blackening treatment, and thus makes image visibility lower. If the Rz value of the metal foil or layer is greater than 10 µm, an adhesive or resist, upon application thereof, does not spread over the entire surface of the metal foil or layer, or involves air to produce air bubbles. The surface roughness Rz is herein a mean value of 10 measurements obtained in accordance with JIS-B0601 (1994 edition).

(Blackening and/or Anticorrosion Treatment) In order to improve the visibility of the image displayed on a display by making the electromagnetic wave shielding material 1 absorb extraneous light incident on it, at least the observer-side surface of the electrical conductor in the form of a mesh may be subjected to conventional blackening treatment for contrast enhancement. In order to give corrosion-preventing properties and prevent falling or deformation of the blackening treatment layer, a conventional anticorrosive layer may be formed on the electrical conductor in the form of a mesh and/or the blackening treatment layer surface.

(Blackening Treatment) The blackening treatment may be carried out by roughening and/or blackening the predetermined surface of the metal foil or layer, and the deposition of a single metal, a metal oxide or sulfide, or a metal alloy, or a variety of other methods can be employed for this treatment. When the metal foil or layer is iron-made, it is usually exposed to steam at a temperature of about 450 to 470° C. for 10 to 20 minutes, thereby forming an oxide film (blackening film) with a thickness of approximately 1 to 2 µm. Alternatively, the iron-made metal foil or layer may be treated with a chemical agent such as concentrated nitric acid to form a film of an oxide $Fe_3O_4$ (blackening film). When copper foil is used as the metal foil, it is preferable to adopt cathodic electrodeposition plating in which copper foil is subjected to cathodic electrolysis in an electrolyte such as sulfuric acid, copper sulfate, or cobalt sulfate, thereby depositing cationic particles on the copper foil. The cationic particles deposited roughen the copper foil and, at the same time, make the copper foil black in color. Although the cationic particles may be either copper particles or particles of an alloy of copper and another metal, copper-cobalt alloy particles are herein preferred.

(Alloy Particles) Both copper particles and particles of alloys of copper and other metals can be used as the above-described cationic particles, and, of these, copper-cobalt alloy particles are preferred. When copper-cobalt alloy particles are deposited, the metal foil or layer has significantly improved blackness and well absorbs visible light. The colorimetric system "L*, a*, b*, ΔE*" specified by JIS-Z8729 is used to indicate the color tone of the electromagnetic wave shielding sheet, one of the optical properties useful in evaluating electromagnetic wave shielding sheet visibility. When an electromagnetic wave shielding layer has a lower L* (brightness) and smaller absolute values of "a*" and "b*" (lower chroma), electromagnetic wave shielding layer visibility is lower, and image contrast becomes higher. As a result, high image visibility can be obtained. Compared with copper particles, copper-cobalt alloy particles can make "a*" and "b*" as small as nearly zero.

The mean particle diameter of the copper-cobalt alloy particles is preferably from 0.1 to 1 µm. If the mean particle diameter of the copper-cobalt alloy particles is made greater than 1 µm, the electrical conductor layer becomes thin and has impaired processability; for example, the copper foil is broken in the step of laminating it to the substrate 11. In addition, the external appearance of the agglomerated particles becomes poor in denseness, and the non-uniformity of appearance becomes noticeable. On the other hand, copper-cobalt alloy particles with a mean particle diameter of less than 0.1 µm cannot fully roughen the metal foil, which leads to lower image visibility.

(Anticorrosive Layer) In order to prevent corrosion of the electrical conductor such as a metal and/or the blackening treatment layer and falling or deformation of the blackening treatment layer, it is preferable to form an anticorrosive layer on the surface of the electrical conductor, such as a metal, covered at least with the blackening treatment layer. A nickel, zinc and/or copper oxide layer, or a chromate treatment layer can be used as the anticorrosive layer. Generally, it is preferable to conduct zinc plating prior to chromate treatment. A conventional plating process may be employed to form a nickel, zinc and/or copper oxide layer, and the thickness of this layer is approximately 0.001 to 1 µm, preferably from 0.001 to 0.1 µm.

(Chromate Treatment) To carry out the chromate treatment, a chromate treatment liquid is applied to an object to be treated. To apply a chromate treatment liquid, such a coating method as roll coating, curtain coating, squeeze coating, electrostatic spray coating, or dip coating can be employed, and the treated object may be dried without washing it with water. When only one surface is subjected to the chromate treatment, a chromate treatment liquid is applied to the surface by roll coating or the like. When both surfaces are subjected to the chromate treatment, dip coating may be adopted. An aqueous solution containing $CrO_2$ in an amount of 3 g/litter is usually used as the chromate treatment liquid. Besides, solutions prepared by adding, to an aqueous chromic acid solution, various oxycarboxylic acid compounds to partly reduce chromium (VI) to chromium (III) can be used as the chromate treatment liquid as well. The surface turns yellow ranging from light yellow to yellowish brawn, depending on the amount of chromium (VI) deposited on the surface. However, chromium (III) is colorless, and by properly controlling the amount of chromium (III) and that of chromium (VI), it is possible to obtain transparency high enough for practical use. Examples of oxycarboxylic acid compounds useful herein include tartaric acid, malonic acid, succinic acid, lactic acid, glycolic acid, glyceric acid, tropic acid, benzylic acid, and hydroxyvaleric acid. These compounds are used singly, or two or more of these compounds are used in combination. Since these compounds are different in reducing power, the compound(s) is added while monitoring the reduction of chromium (VI) to chromium (III). Specific examples of chromate treatment liquids useful herein include Alsurf 1000 (trade name of a chromate treatment liquid manufactured by Nippon Paint Co., Ltd., Japan), and PM-284 (trade name of a chromate treatment liquid manufactured by Nippon Parkerizing Co., Ltd., Japan). The chromate treatment enhances the effect of the blackening treatment.

Forming the blackening treatment layer and the anticorrosive layer at least on the observer-side surface is fit for the purpose, and these layers enhance contrast to improve image visibility. These layers may also be formed on the other surface, that is, on the display-screen-side surface. In this case, they cut stray light the display generates, so that the image visibility is further improved.

(Lamination) Examples of methods of laminating the electromagnetic wave shielding layer 15 to the transparent substrate 11 include a method called dry lamination by those skilled in the art, in which the two layers are laminated with an adhesive layer 13, and a method called direct lamination that the electromagnetic wave shielding layer 15 is laminated directly to the transparent substrate 11 by plating without using an adhesive layer. For this plating, it is possible to employ a conventional plating process that the substrate 11 is plated either electrolytically or electrolessly.

(Dry Lamination) Dry lamination is a method of laminating two types of materials in the following manner: by such a coating method as roll, reverse roll, or gravure coating, an adhesive dispersed or dissolved in a solvent is applied to one of the two materials so that the layer applied has a thickness of approximately 0.1 to 20 μm, preferably 1 to 10 μm, when dried, and the solvent is evaporated to form an adhesive layer; immediately after forming the adhesive layer, the other laminating material is superposed on the adhesive layer; and this laminate is aged at 30 to 80° C. for several hours to several days to harden the adhesive. The adhesive that can be used in the dry lamination includes adhesives made from thermosetting resins or ionizing-radiation-curing resins that cure in ionizing radiation such as ultraviolet light or electron beams.

Specific examples of thermosetting resin adhesives useful herein include two-pack curable urethane adhesives, acrylic adhesives, and rubber adhesives, and, of these adhesives, two-pack curable urethane adhesives are preferred. Two-pack curable urethane adhesives cure because of the reaction of polyfunctional polyols and polyfunctional isocyanates. Examples of polyfunctional polyols include polyester polyols, acryl polyols, and polyether polyols. Examples of polyfunctional isocyanates include tolylene diisocyanate, xylene diisocyanate, hexamethylene diisocyanate, isophorone diisocyanate, and addition products or polymers of-these compounds.

(Mesh) The electromagnetic wave shielding layer 15 having no openings at all, formed in the above-described manner, is made into a mesh. The mesh has a mesh portion 103 that will be faced to a display screen 100, and a transparent resin layer anchoring portion 105 that surrounds the mesh portion 103. A photolithographic process can be employed to make the mesh.

(Photolithography) After forming a mesh-patterned resist layer on the electromagnetic wave shielding layer 15 face of the above-described laminate, the electrical conductor layer is etched to remove those portions that are not covered with the resist layer, and the resist layer is then stripped, thereby obtaining a mesh-patterned electromagnetic wave shielding layer. As shown in FIG. 1, a plane view, the electromagnetic wave shielding layer 15 is composed of a mesh portion 103 (the innermost part), a transparent resin layer anchoring portion 105, and a frame portion 107 having no openings (the outermost part). As shown in FIG. 2(A), an enlarged plane view, and in FIG. 2(B), an enlarged cross-sectional view, the mesh portion 103 and the transparent resin layer anchoring portion 105 have line portions 103*b*, 105*b*, the remaining portions of the metal layer, by which a plurality of openings 103*a*, 105*a* are defined; while the frame portion 107 has no openings and is made up of the remaining metal layer.

Also in the photolithography, it is preferable to process a belt-shaped laminate in the form of a continuously wound-up roll, as in the laminating. While unwinding and carrying the laminate of the transparent substrate 11 and the electromagnetic wave shielding layer 15 either continuously or intermittently, masking, etching, and resist stripping are conducted, with the laminate stretched and non-loosened. First, masking is conducted in the following manner: a photosensitive resist, for example, is applied to the electromagnetic wave shielding layer (electrical conductor layer) and is dried; this resist layer is subjected to contact exposure, using an original plate (photomask) having a predetermined pattern (consisting of the line portions of the mesh portion and the frame portion); thereafter, development with water, film-hardening treatment, and baking are conducted. The resist is applied in the following manner: while continuously or intermittently unwinding and carrying the belt-shaped, wound-up laminate, a resist made from casein, PVA, or gelatin is applied to the electromagnetic wave shielding layer face of the laminate by such a method as dipping (immersion), curtain coating, or flow coating. Alternatively, a dry film resist may be used as the resist; the use of a dry film resist can improve working efficiency. Although baking is generally conducted at a temperature of 200 to 300° C. when casein resist is used, it is herein preferred that the baking be conducted at a temperature below 100° C. and as low as possible in order to prevent the laminate from curling.

(Etching) Etching is effected after masking the laminate. Since etching is continuously effected in the present invention, it is preferable to use, as an etchant, a ferric or cupric chloride solution that can be readily circulated. Further, the etching process is basically the same as the process of producing a shadow mask for a cathode ray tube of a color TV, in which belt-shaped continuous steel stock, especially a thin plate with a thickness of 20-80 µm, is etched. It is therefore possible to use the existing facilities for the production of the shadow mask and continuously effect a series of the steps of from masking to etching, so that the production efficiency is extremely high. The etched laminate is subjected to washing with water, resist stripping with an alkaline solution, and cleaning, and is then dried.

(Mesh Portion) The mesh portion 103 is an area surrounded by the frame area 101 including the transparent resin layer anchoring portion 105 and the frame portion 107. The mesh portion 103 has line portions 103b that define a plurality of openings 103a. The openings 103a are not limited in shape (mesh pattern), and the shape of each opening 103a may be a triangle such an equilateral triangle, a square such as a regular square, rectangle, rhombus or trapezoid, a polygon such as a hexagon, a circle, an oval, or the like. The openings 103a in a shape of only one type, or of two or more types, form the mesh portion 103. From the viewpoint of opening ratio and mesh visibility, the line width is made 25 µm or less, preferably 20 µm or less. From the viewpoint of light transmittance, the line distance (line pitch) is made 150 µm or more, preferably 200 µm or more. The opening ratio (the percentage of the area of the openings to the whole area) is made about 85 to 95%. In order to avoid the occurrence of moiré fringes or the like, the bias angle (the angle between the line portions of the mesh and the sides of the electromagnetic wave shielding material) is properly selected with consideration for the pixel and emission properties of a display.

(Transparent resin layer anchoring portion) The mesh pattern of the transparent resin layer anchoring portion 105 is made the same as that of the mesh portion 103. Namely, this pattern has openings 105a that are the same as the openings 103a in the mesh portion 103 in shape, size, and opening ratio. Although it is, of course, desirable that the pattern of the transparent resin layer anchoring portion 105 be quite the same as that of the mesh portion 103, the openings 105a that are slightly different in size and shape from the openings 103a that form the pattern of the mesh portion are also accepted, in order to make allowances for errors that are caused by the production environment, the mask used, or the accuracy in processing, or for the reason on design that the line width in the mesh is slightly increased so that the transparent resin layer anchoring portion can withstand stress concentration that occurs in the boundary area between the mesh portion 103 and the frame portion 107 having no openings. If the above-described small difference is acceptable, the two-mesh patterns can be produced by the use of a single mask. The process of making the meshes is thus simplified, and low-cost production can be realized. Further, when facing the mesh portion 103 of the electromagnetic wave shielding material 1 and a display screen 100 to each other, it is not necessary to make accurate positioning of the two, so that the yield is improved.

(Smoothing and Improvement in Transparency) The transparent resin layer 17 has the functions of smoothing the mesh portion and making this part transparent. Namely, in the case where the mesh portion 103 and the transparent resin layer anchoring portion 105 are formed, the line portions 103b, 105b have a thickness equal to the thickness of the electromagnetic wave shielding layer 15; however, those portions of the electromagnetic wave shielding layer 15 that correspond to the openings 103a, 105b are removed and become void, so that the electromagnetic wave shielding layer 15 has irregularities. If an adhesive (or a pressure-sensitive adhesive) is applied to the electromagnetic wave shielding layer 15 in the subsequent step, these voids are filled with the adhesive or pressure-sensitive adhesive. However, in the case where the electromagnetic wave shielding material is attached to a display immediately after making the openings 103a, 105a, the electromagnetic wave shielding layer 15 is smoothed by filling the voids with the transparent resin layer 17. This is because if the electromagnetic wave shielding layer 15 remains roughened, workability is poor. Further, if the transparent resin layer 17 is missing, the transparent substrate 11 or the adhesive layer 13 would be exposed at the bottom of the openings, and the surface of the transparent substrate 11 or that of the adhesive layer 13, especially the surface of the adhesive layer 13, would have irregularities caused by the irregularities of the electromagnetic wave shielding layer 15. The surface of the transparent substrate 11 or that of the adhesive layer 13 would be considerably poor in transparency because the surface irregularities irregularly reflect light. By smoothing these irregularities by filling them with the transparent resin layer 17, it is possible to improve transparency.

For smoothing, a transparent resin is applied to fill the concavities. If the transparent resin does not come into all the corners of the concavities, air remains to form air bubbles, resulting in decrease in transparency. To avoid this trouble, a solution prepared by dissolving a transparent resin in a solvent or the like, having low viscosity, is applied and dried, or a transparent resin is applied while deaerating, to form the transparent resin layer 17. "Smoothing" herein means that the roughened surface is smoothed to such an extent that a displayed image is not distorted and that haze is not brought about by the diffusion of light, and accepts the existence of fine irregularities (matted) in the smoothed surface, as long as they neither deform the image nor bring about haze, in order to prevent surface blocking, or prevent air (air bubbles) from remaining between the electromagnetic wave shielding layers when the electromagnetic wave shielding material is wound up or piled up. Namely, the mesh portion having irregularities due to its openings is smoothed to have a smooth surface and transparency, and, at the same time, microscopically fine irregularities that are much smaller than the irregularities caused by the openings in the mesh portion may be partially produced in this smooth surface in order to prevent the electromagnetic wave shielding sheet from including air bubbles in the step of winding the electromagnetic wave shielding material into a roll.

(Transparent Resin Layer) Any resin layer can be used as the transparent resin layer 17 if it is highly transparent and has good adhesion to the electrical conductor in the form of a mesh and also to an adhesive that is applied in the subsequent step. However, a transparent resin layer 17 with a surface having protrusions, concavities, or unevenness is unfavorable because it causes moiré fringes, unevenness in interference, or Newton's rings when the electromagnetic wave shielding material is mounted on the front of a display. A preferred method for forming the transparent resin layer 17 is as follows: a thermosetting or ionizing-radiation-curing resin is applied by conventional intermittent die coating or the like to form a resin layer in the desired pattern; a release substrate having release properties, being excellent in smoothness, is laminated to the resin layer, and heat or ultraviolet light is applied to cure the applied resin; and the release substrate is then separated from the resin layer for removal. The surface of the transparent resin layer 17 thus formed is flat and smooth because of the surface smoothness of the release substrate.

(Ionizing-Radiation-Curing Resin) Any resin selected from a variety of natural resins and synthetic resins can be used as the resin for the transparent resin layer 17. The resin may be a thermosetting resin, an ionizing-radiation-curing resin, or the like, and an ultraviolet-curing acrylic resin is preferred because of its durability, coating properties and easiness of smoothing, as well as the smoothness of the resulting resin layer. The transparent resin layer of an ionizing-radiation-curing resin is a cured product of an ionizing-radiation-curing resin or its composition obtained by polymerizing an oligomer and/or monomer having a functional group that can cause crosslinking or polymerization reaction, without an initiator or owing to the action of an initiator, when exposed to ionizing radiation, typically ultraviolet rays or electron beams.

Oligomers or monomers that can form ionizing-radiation-curing resins are radically polymerizable ones having, in their molecules, an ethylenic double bond such as acryloyl group, methacryloyl group, acryloyloxy group, or methacryloyloxy group. Besides, cationically polymerizable oligomers and/or monomers, such as epoxy-group-containing compounds, can also be used.

(Ionizing Radiation) Ionizing radiation refers to electromagnetic waves or charged particle rays having energy quanta high enough to polymerize or cross-link molecules, and ultraviolet light, an electron beam, or the like is usually used as the ionizing radiation. In the case where ultraviolet light is employed as the ionizing radiation, a high-pressure mercury vapor lamp, a low-pressure mercury vapor lamp, a metal halide lamp, a carbon-arc lamp, a black light lamp, or the like is used as an irradiation unit (light source). The energy (wavelength) of ultraviolet light is preferably about 190 to 450 nm, and the amount of ultraviolet light to be applied is preferably about 50 to 1000 mJ/cm$^2$. When an electron beam is employed, an electron beam accelerator selected from Cockcroft-Walton accelerators, Van de Graaff accelerators, resonance-transformer-type accelerators, insulation-core-type accelerators, linear accelerators, dynamitron accelerators, high-frequency accelerators, and so forth is used as an irradiation unit (light source). The energy (accelerating voltage) of the electron beam is 70 to 1000 keV, preferably about 100 to 300 keV, and the preferred amount of the electron beam to be applied is usually about 0.5 to 30 Mrad. In the case where an electron beam is used for curing, it is not necessary to incorporate a polymerization initiator in the ionizing-radiation-curing resin composition in advance.

(Coating Position of Transparent Resin Layer) The coating position of the transparent resin layer 17 is important.

Essentially, the transparent resin layer 17 is, as shown in FIG. 3(A), formed so that it covers the surface of the mesh portion 103, further stretches over the surface of the transparent resin layer anchoring portion 105, and fills all of the openings 103a, 105a, without coming in the frame portion 107 having no openings. It is however not easy to form the transparent resin layer 17 in this manner because this manner demands accurate control of the position of coating of the transparent resin layer 17.

Accordingly, as shown in FIG. 3(B), the transparent resin layer 17 is formed so that it covers the surface of the mesh portion and that of the inner peripheral portion of the transparent resin layer anchoring portion 105 and fills the openings 103a in the mesh portion and the openings 105 in the inner peripheral portion, with the openings 105a in the outer portion of the transparent resin layer anchoring portion 105 left non-covered, non-filled with the transparent resin layer 17. If the transparent resin layer 17 is formed in this manner, even when the coating position of the transparent resin layer 17 is shifted forward or backward, or to the right or left, it is possible to prevent the position of the end of the transparent resin layer 17 from receding in the mesh portion. 103 or coming in the frame portion 107 having no openings. As shown in FIG. 3(C), even when the transparent resin layer 17 is formed so that it covers the mesh portion 103 and the transparent resin layer anchoring portion 105, fills the openings 103a, 105a, and slightly comes in the frame portion 107 having no openings, if the width of the transparent resin layer 17 present in the frame portion 107 is equal to approximately 3 opening pitches or less, more preferably 1 opening pitch or less, the prevention of separation of the transparent resin layer 17 from the electromagnetic wave shielding layer 15 can be anticipated, and the effect of the present invention can be obtained.

Figure 4:
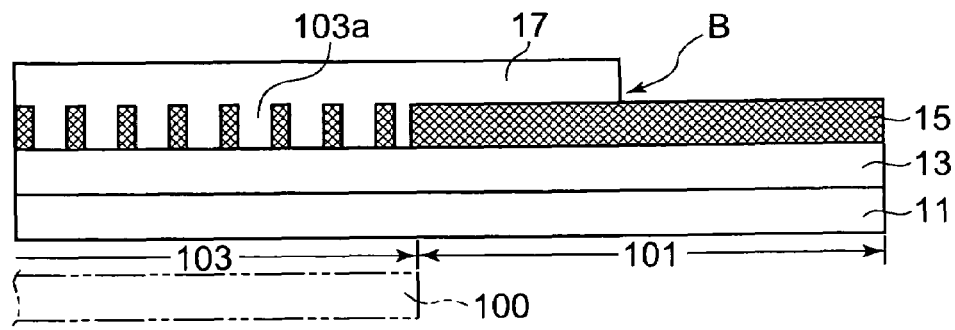
FIG. 4 is a sectional view of the essential part of a conventional electromagnetic wave shielding device, illustrating the conventional position of a transparent resin layer.

FIG. 4 is a sectional view of the essential part of a conventional electromagnetic wave shielding sheet, illustrating the conventional position of a transparent resin layer.

Namely, the conventional position of coating of a transparent resin layer 17 is as shown in FIG. 4. The transparent resin layer 17 is formed in the following manner: openings 103a in a mesh portion 103 that will be faced to a display screen are firstly filled with the transparent resin layer 17; since no transparent resin layer anchoring portion is present, the transparent resin layer 17 is then made to come in a frame area (or frame portion) 101 having no openings to cover a portion, with a width of about 2 to 3 mm or more (10 opening pitches or more), of the frame area, in order to ensure that the transparent resin layer 17 will fully cover the mesh portion 103 even if the position of coating of the transparent resin layer 17 varies by approximately 2 to 3 mm.

The adhesion between the transparent resin layer 17 and the frame portion 101 is poorer than the adhesion between the transparent resin layer 17 and the adhesive layer 13 or the transparent substrate 11. Therefore, when the transparent resin layer 17 covers a large part of the frame area 101, the following trouble has occurred so far: the transparent resin layer lifts from or is separated from the electromagnetic wave shielding layer because of external forces exerted in the whole process ranging from the production of the electromagnetic wave shielding material 1 to the mounting of the electromagnetic wave shielding material 1 on a display, or because of stress caused by the difference between the degrees of shrinkage of the layers when the substrate regularly shrinks for a long duration of service by repeatedly undergoing warming and cooling, or repeatedly absorbing and releasing moisture. Moreover, since the frame portion 101 has no openings, the portion of the frame portion 101 covered with the transparent resin layer 17 and the other portion of the frame portion 101 not covered with the transparent resin layer 17 produce difference in level, which tends to be a cause of separation of the transparent resin layer from the frame portion.

On the other hand, in the electromagnetic wave shielding material 1 of the present invention, since the transparent resin layer 17 fills the openings 103a in the mesh portion 103 and the openings 105a in the transparent resin layer anchoring portion 105, the physical anchor effect is great. Moreover, there is the synergistic effect of the anchor effect and the previously mentioned effect of improving the adhesion of the transparent resin layer 17 to the adhesive layer 13 or the transparent substrate 11. Therefore, the separation of the transparent resin layer 17 from the electromagnetic wave shielding layer 15 is avoidable.

Figure 3:
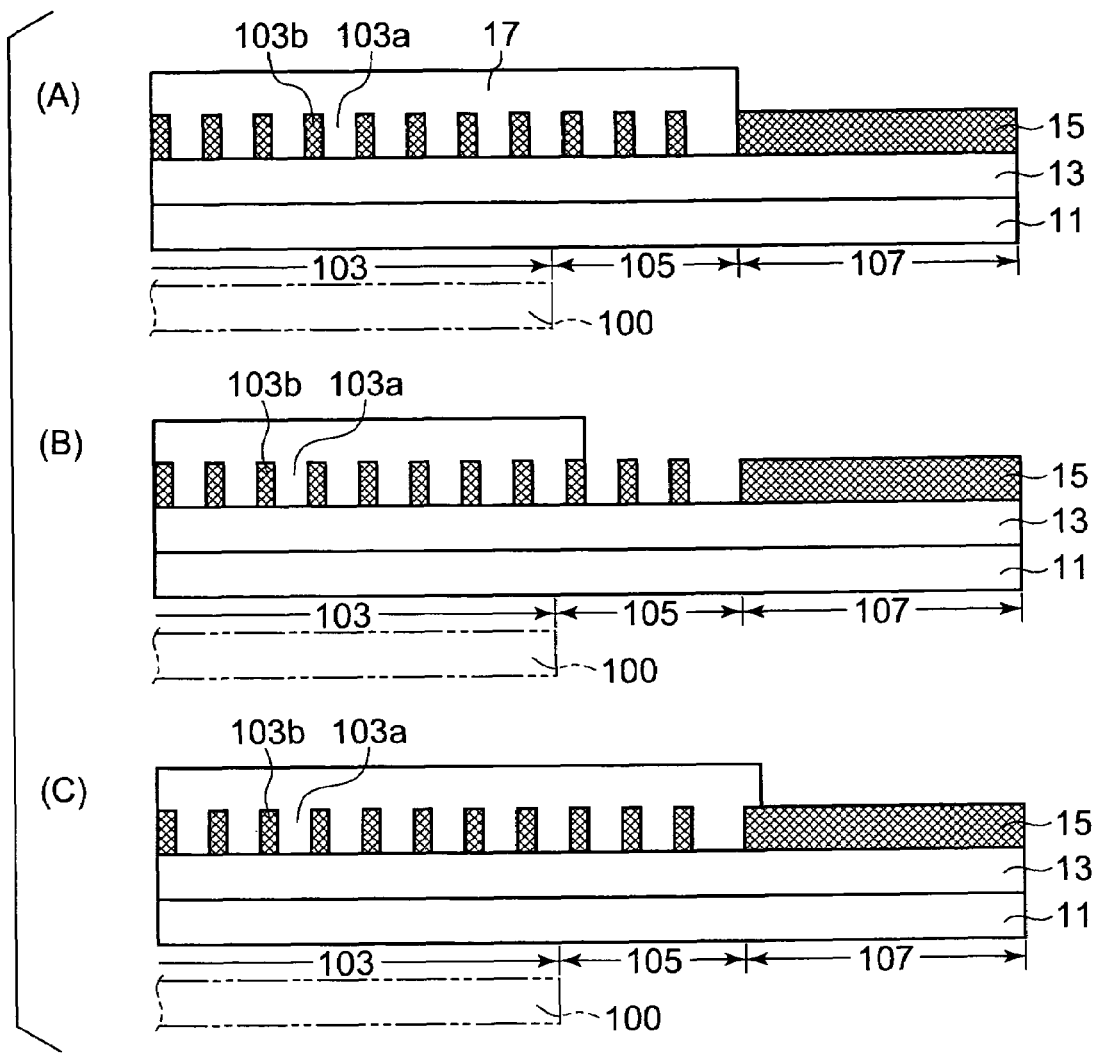
FIGS. 3(A), 3(B) and 3(C) are sectional views of the essential parts of electromagnetic wave shielding devices of the present invention, illustrating the position of constituent layers.

Namely, in the present invention, the transparent resin layer anchoring portion 105 is made at the inner periphery of the frame portion 107 so that it surrounds the mesh portion 103, and the transparent resin layer 17 is formed so that it covers and fills at least a part of the openings 105a in the transparent resin layer anchoring portion 105, as shown in FIG. 3. By doing so, there can be obtained ply adhesion and anchor effect, so that the transparent resin layer 17 does not lift from or is not separated from the mesh portion in the course of production and for the duration of service. In addition, the electromagnetic wave shielding material shows excellent electromagnetic wave shielding properties owing to the electromagnetic wave shielding layer 15, and has moderate transparency (visible light transmittance) because the irregularities in the bottom faces of the openings are smoothed.

Further, the electromagnetic wave shielding material 1 of the present invention may be produced so that it has such functions as the function of absorbing visible light and/or near infrared light with specific wavelengths, the function of preventing reflection of light, the function of hard coat, the function of preventing staining, and the function of preventing glaring. Alternatively, a layer having any of the above-described functions may be formed on the front or back surface of the electromagnetic wave shielding material 1 and/or between the constituent layers of the electromagnetic wave shielding material 1.

(NIR-Absorbing Layer) Further, a light-absorbing agent that absorbs unwanted visible light and/or near infrared light with specific wavelengths may be added to the resin that is used for the transparent resin layer 17. If visible light with specific wavelengths is absorbed, the reproduced color image has no unnaturalness, gives no uncomfortable feel, and is viewed with enhanced visibility. Since a great part of the unwanted visible light with specific wavelengths emitted from PDPs is orange light with wavelengths around 590 nm, originated from the emission spectrum of neon atom, it is preferable to use a light-absorbing agent capable of moderately absorbing light of around 590 nm. The specific wavelengths of near infrared light are in the range of about 780 to 1100 nm. It is desirable that the light-absorbing agent absorbs 80% or more of light in the wave range of 780 to 1100 nm. By absorbing near infrared rays with the specific wavelengths, it is possible to prevent the malfunction of remotely controlled apparatus that operate with near infrared rays and are placed near a display. Any near infrared-ray absorber (NIR absorber) is herein useful, and it is possible to use colorants that show sharp absorption in the near infrared region, have high transmittance for visible light, and show no great absorption at the specific wavelengths in the visible light range. Examples of colorants that absorb unwanted visible light with the specific wavelengths include polymethine dyes and porphyrin dyes.

Examples of near-infrared-ray-absorbing colorants include diimmonium compounds, cyanine compounds, phthalocyanine compounds, and dithiol complexes. In the case where an NIR absorber is not incorporated in the transparent resin layer 17, a separate layer containing an NIR absorber (referred to as an NIR-absorbing layer) may be formed at least on one surface of the transparent resin layer 17.

(Separate NIR-Absorbing Layer) A separate NIR-absorbing layer may be formed on the transparent resin layer 17 and/or the substrate 11. To form the separate NIR-absorbing layer, a commercially available NIR-absorber-containing film (e.g., trade name No. 2832, manufactured by Toyobo Co., Ltd., Japan) may be laminated to the transparent resin layer 17 by an adhesive, or a mixture of a binder and the above-described NIR absorber may be applied to the transparent resin layer 17. Examples of the binder useful herein include polyester resins, polyurethane resins, acrylic resins, and curable resins such as thermosetting or ultraviolet-curing resins having epoxy group, acrylate group, methacrylate group, isocyanate group, or the like that causes curing reaction.

(AR Layer) Although not shown in the figures, an antireflection layer (referred to as an AR layer) may also be formed on the observer-side face of the electromagnetic wave shielding material. The antireflection layer is for preventing reflection of visible light, and various antireflection layers composed of a single layer or multiple layers are commercially available. To form an antireflection layer composed of a single layer, a low-refractive-index layer is laminated to the surface of the electromagnetic wave shielding material. To form an antireflection layer composed of multiple layers, high-refractive-index layers and low-refractive-index layers are alternately laminated to the electromagnetic wave shielding material so that a low-refractive index layer forms the outermost layer. Examples of the material for the high-refractive-index layer include niobium oxide, oxides of titanium, zirconium oxide, and ITO. Examples of the material for the low-refractive-index layer include magnesium fluoride and oxides of silicon. Further, antireflection layers having surfaces with fine irregularities that irregularly reflect extraneous light are also available.

(Hard Coat Layer, Anti-Staining Layer, Anti-Glaring Layer) A hard coat layer, an anti-staining layer, and an anti-glaring layer may also be formed on the antireflection (AR) layer. The hard coat layer is a layer having a hardness of H or more as determined by the pencil hardness test according to JIS-K5400, formed by curing, with heat or ionizing radiation, a polyfunctional acrylate such as polyester acrylate, urethane acrylate, or epoxy acrylate. The anti-staining layer is a water-repellent, oil-repellent coating, and a siloxane compound, a fluorinated alkylsilyl compound, or the like can be used for this layer. The anti-glaring layer is a layer having a surface with fine irregularities that irregularly reflect extraneous light.

(Direct Attachment) If at least the blackening treatment layer and the anticorrosive layer are formed on the electromagnetic wave shielding layer in the form of a mesh, the electromagnetic wave shielding material can be attached directly to such a display as a PDP, with the electromagnetic wave shielding layer directed to the observer side. Since the frame portion 107 is bare, it is easy to draw an electrode, and the electromagnetic wave shielding material can therefore be readily grounded.

Further, the frame portion 101 has been subjected to the blackening treatment, and the blackened surface is directed to the observer side. Therefore, the conventional printing of a black-colored frame on a front glass panel is not required, which leads to shortening of the process and is also advantageous from the viewpoint of cost.

The present invention will now be explained more specifically by way of Examples and Comparative Example. However, the present invention is not limited to the following Examples.

EXAMPLES

Example 1

An electrical conductor obtained by successively forming, on one surface of electrolytic copper foil with a thickness of 10 µm, a blackening layer of copper-cobalt alloy particles with a mean particle diameter of 0.3 µm and a chromate (treatment) layer was used as the electromagnetic wave shielding layer 15. The electromagnetic wave shielding layer 15 was laminated to a transparent substrate 11, a 100-µm thick biaxially oriented film A4300 (trade name of a polyethylene terephthalate film manufactured by Toyobo Co., Ltd., Japan), by an adhesive 13, a two-pack curable urethane adhesive, with the chromate (treatment) layer face of the copper-cobalt alloy particle layer facing to the transparent substrate 11, and this laminate was aged at 56° C. for 4 days. A two-pack curable urethane resin adhesive consisting of polyester urethane polyol, a main agent, and xylene diisocyanate, a curing agent, was used as the adhesive 13. The adhesive was applied in such an amount that the dried adhesive layer had a thickness of 7 μm.

The existing production line for a shadow mask for a color TV, in which a belt-shaped continuous web was subjected to a series of the steps of from masking to etching, was used to photolithographically make the laminate into a mesh. First, a casein resist was applied to the entire surface of the electrical conductor layer by flow coating. This laminate was carried to the next station, where it was subjected to contact exposure to ultraviolet light from a mercury vapor lamp, using an original plate having the following pattern. The laminate was then transferred from one station to another for development with water, for film-hardening treatment, and for baking by heating.

As shown in FIG. 1, the pattern of the above-described original plate had a mesh portion 103 that would be faced to a screen 100 of a 42-type display (oblong, a display whose diagonal is 42 inches in length) and that had line portions with a line width of 22 μm, a line distance (pitch) of 300 μm, and a bias angle of 49 degrees, defining regular square openings 103a; a 5-mm wide transparent resin layer anchoring portion 105 surrounding the mesh portion 103, having openings 105a in the same shape as that of the openings 103a, at the same opening ratio as that of the openings 103a; and a 10-mm wide frame portion 107 surrounding the transparent resin layer anchoring portion 105, having no openings.

The baked laminate was further carried to the next station, where after spraying an aqueous ferric chloride solution, an etchant, over the laminate, the laminate was etched to make openings 103a, 105a. While transferring from one station to another, the laminate was subjected to washing with water, resist stripping, cleaning, and drying by heating. Although the resist-patterning plate having line portions with a line width of 22 μm was used to make the openings in the mesh portion 103 and in the transparent resin layer anchoring portion 105, the line width measured after the etching step was 12±5 μm (7 to 17 μm). As a result, both the mesh portion 103 and the transparent resin layer anchoring portion 105 had an opening ratio of 92%.

To the mesh portion 103 and the transparent resin layer anchoring portion 105 that had been made in the above-described manner, a transparent-resin-layer-forming composition having the following formulation was applied by intermittent die coating, thereby forming a transparent resin layer 17 in the same pattern as that having the mesh portion 103 and the transparent resin layer anchoring portion 105 (i.e., a pattern having the mesh portion and the 5-mm wide part surrounding the mesh portion). To the transparent resin layer was laminated a 50-μm thick SP-PET20-BU (trade name of a PET film with a surface subjected to release treatment, manufactured by TOHCELLO, Co., Ltd., Japan), and this laminate was exposed to 200 mJ/cm² (as calculated for light of 365 nm) of light from a high-pressure mercury vapor lamp.

The following is the formulation of the transparent-resin-layer-forming composition: 20 parts by weight of N-vinyl-2-pyrrolidone, 25 parts by weight of dicyclopentenyl acrylate, 52 parts by weight of oligoester acrylate (M-8060 manufactured by Toa Gosei Chemical Industry Co., Ltd., Japan), and 3 parts by weight of 1-hydroxycyclohexyl-phenyl ketone (Irgacure 184, manufactured by CIBA-GEIGY AG.).

The PET film SP-PET20-BU was then separated. Thus, there was obtained an electromagnetic wave shielding material of Example 1 in which the mesh portion 103 and the transparent resin layer anchoring portion 105 had been smoothed by covering and filling the openings 103a, 105a in the mesh portion 103 and the transparent resin layer anchoring portion 105, respectively, with the transparent resin layer 17, as shown in FIG. 3(A).

Example 2

An electromagnetic wave shielding material of Example 2 in which the openings 103a in the mesh portion 103 and a part of the openings 105a in the transparent resin layer anchoring portion 105, existing in the inner peripheral portion of the transparent resin layer anchoring portion 105, had been covered with and filled with the transparent resin layer 17 for smoothing, as shown in FIG. 3(B), was obtained in the same manner as in Example 1, except that the transparent-resin-layer-forming composition was applied to the mesh portion 103 and also to a 2.5-mm wide, mesh portion-surrounding portion of the transparent resin layer anchoring portion 105. The openings 105a in the 2.5-mm wide outer portion of the transparent resin layer anchoring portion 105 were left exposed.

Example 3

An electromagnetic wave shielding material of Example 3 in which the openings 103a in the mesh portion 103 and the openings 105a in the transparent resin layer anchoring portion 105 were covered with and filled with the transparent resin layer 17, and a 0.5-mm wide (equivalent to 1.7 opening cycles) inner peripheral portion of the frame portion 107 having no openings was also covered with the transparent resin layer 17 was obtained in the same manner as in Example 1, except that the transparent-resin-layer-forming composition was applied to the mesh portion 103, to the transparent resin layer anchoring portion 105 surrounding the mesh portion 103, and to the part surrounding the transparent resin layer anchoring portion 105 so that the total width of the parts covered with the composition was 5.5 mm.

(Comparative Example 1) An electromagnetic wave shielding material of Comparative Example 1 was obtained in the same manner as in Example 1, except that the original plate used in Example 1 was replaced with an original plate having a mesh portion 103 that would be faced to a screen of a 42-type display (oblong, a display whose diagonal is 42 inches in length) and that had line portions with a line width of 22 μm, a line distance (pitch) of 300 μm, and a bias angle of 49 degrees, defining regular square openings; and a 15-mm wide frame portion 101 having no openings, directly surrounding the mesh portion 103 without the transparent resin layer anchoring portion 105, and that the transparent-resin-layer-forming composition was applied to the mesh portion 103 and to a 3.5-mm wide (equivalent to 11.7 opening cycles) mesh portion-surrounding inner portion of the frame portion 107 having no openings.

(Method of Evaluation) Evaluation was made in terms of ply adhesion after thermal shock test. The thermal shock test was conducted in the following manner: after subjecting the electromagnetic wave shielding material repeatedly 100 times to alternations between cooling to −40° C. for 1 hour and heating to 80° C. for 1 hour, Cellotape (trademark), a 25-mm wide pressure-sensitive cellophane tape manufactured by Nichiban Co., Ltd., Japan, was adhered at room temperature, 25° C., to the area covering the transparent resin layer and the frame portion not coated with the transparent resin layer and was then forcibly peeled first from the portion not coated with the transparent resin layer and then from the transparent resin layer.

The electromagnetic wave shielding material in which the transparent resin layer had lifted from or had been separated from the transparent substrate and/or the electromagnetic wave shielding layer was rated as unacceptable; while the electromagnetic wave shielding material in which the above-described lifting or separation had not occurred was rated as acceptable. In addition, the total luminous transmittance, the visibility, and the electromagnetic wave shielding efficiency were also determined.

The visibility was determined in the following manner: the electromagnetic wave shielding material was mounted on the front of a PDP "WOOO" (trade name, manufactured by Hitachi, Ltd., Japan); a test pattern, a white solid image, and a black solid image were successively displayed on the screen; and the images were visually observed at a point 50 cm distant from the screen, at an angle of 0 to 80 degrees.

The total luminous transmittance was measured at the mesh portion with a color meter HM150 (trade name, manufactured by Murakami Color Research Laboratory, Japan) in accordance with JIS-K7361-1.

The electromagnetic wave shielding efficiency was determined by the KEC method (a method of measuring electromagnetic waves developed by Kansai Electronic Industry Development Center, Japan).

(Results of Evaluation) The mesh portions of all of the electromagnetic wave shielding materials of Examples 1 to 3 and Comparative Example 1 had a total luminous transmittance as high as 83.0%. Further, all of the electromagnetic wave shielding materials of Examples 1 to 3 and Comparative Example 1 attenuated, at rates of 30 to 60 dB, electromagnetic waves having frequencies of 30 MHz to 1000 MHz. They were thus confirmed excellent in electromagnetic wave shielding properties.

The results of evaluation of the ply adhesion after thermal shock test were as follows: the electromagnetic wave shielding materials of Examples 1 to 3 were rated as acceptable, because no lifting or separation of the transparent resin layer was observed; while the electromagnetic wave shielding material of Comparative Example 1 was rated as unacceptable, because minor lifting or separation of the transparent resin layer was observed in the frame portion.

Each one of the electromagnetic wave shielding materials of Examples 1 to 3, which had been rated as excellent in ply adhesion, was mounted on the front of the PDP display, and the image visibility was evaluated. As a result, these electromagnetic wave shielding materials were confirmed excellent in image visibility.

The invention claimed is:

1. An electromagnetic wave shielding device disposed adjacent to the front surface of an image displaying device, comprising:
   a transparent substrate,
   an electromagnetic wave shielding layer on one surface of the transparent substrate and formed of an electrical conductive material; and
   a transparent resin layer provided on the electromagnetic wave shielding layer,
   wherein the electromagnetic wave shielding layer includes a mesh portion corresponding to a screen portion of the image displaying device, including openings arranged in large numbers, a transparent resin layer anchoring portion surrounding the mesh portion, including opening arranged in large numbers and having the same opening ratio as that of the openings in the mesh portion, and a flat frame portion surrounding the transparent resin layer anchoring portion and not, having openings, and
   wherein the transparent resin layer is provided such that it extends over the surface of the mesh portion as well as over the surface of the transparent resin layer anchoring portion.

2. The electromagnetic wave shielding device according to claim 1, wherein
   the transparent resin layer extends over the whole surface of the mesh portion as well as over the whole surface of the transparent resin layer anchoring portion and also covers an inner end portion of the frame portion.

3. The electromagnetic wave shielding device according to claim 1, wherein
   the transparent resin layer extends the whole surface of the mesh portion as well as over the whole surface of the transparent resin layer anchoring portion, and terminates at the outer end portion of the transparent resin layer anchoring portion.

4. The electromagnetic wave shielding device according to claim 1, wherein
   the transparent resin layer is provided to cover the whole surface of the mesh portion and an inner end portion of the transparent resin layer anchoring portion.

5. The electromagnetic wave shielding device according to claim 4, wherein
   the transparent resin layer extends over the whole surface of the mesh portion up to a middle of the transparent resin layer anchoring portion, but does not cover the outer periphery of the transparent resin layer anchoring portion.

6. The electromagnetic wave shielding device according to claim 1, wherein
   an adhesive layer is interposed between the transparent substrate and the electromagnetic wave shielding layer.

* * * * *